United States Patent [19]

Mauthe et al.

[11] 4,412,344

[45] Oct. 25, 1983

[54] INTEGRATED RECTIFIER CIRCUIT

[75] Inventors: Manfred Mauthe, Munich; Hans-Jörg Pfleiderer, Zorneding, both of Fed. Rep. of Germany

[73] Assignee: Siemens Aktiengesellschaft, Berlin & Munich, Fed. Rep. of Germany

[21] Appl. No.: 161,134

[22] Filed: Jun. 19, 1980

[30] Foreign Application Priority Data

Aug. 31, 1979 [DE] Fed. Rep. of Germany ....... 2935292

[51] Int. Cl.³ .................. G11C 19/28; H01L 29/78
[52] U.S. Cl. .................................. 377/60; 357/24
[58] Field of Search .............. 357/24; 307/221 D; 377/60

[56] References Cited

U.S. PATENT DOCUMENTS 4,010,484  3/1977  Mohsen .................... 357/24 R
4,314,163  2/1982  Knauer et al. ............. 307/221 D

OTHER PUBLICATIONS

Tompsett et al., "Use of Charge-Coupled Devices for Delaying Analog Signals" IEEE J. Solid-State Circuits, vol. SC-8 (4/73) pp. 151-157.

*Primary Examiner*—Gene M. Munson
*Attorney, Agent, or Firm*—Hill, Van Santen, Steadman & Simpson

[57] ABSTRACT

An integrated rectifier circuit has a doped semiconductor body having first and second oppositely doped regions therein and is covered by an electrically insulating layer on which a first pair of input gate electrodes are disposed which are associated with the first oppositely doped region and on which a second pair of input gate electrodes are disposed associated with the second oppositely doped region. The oppositely doped regions are connected to a clock pulse voltage and all of the input gate electrodes are connected to a constant voltage having a magnitude such that a uniform surface potential exists in the semiconductor regions covered by the electrodes. The input gate electrode of the first pair which is disposed at a greater distance from the first oppositely doped region and the input gate electrode of the second pair which is disposed closer to the second oppositely doped region are charged with the alternating voltage component of an input signal. A charge transfer device transfer channel covered with transfer electrodes is connected to the semiconductor regions covered by the input electrodes and a charge transfer device output stage couples an output signal to external circuitry in which the alternating voltage component is rectified.

5 Claims, 17 Drawing Figures

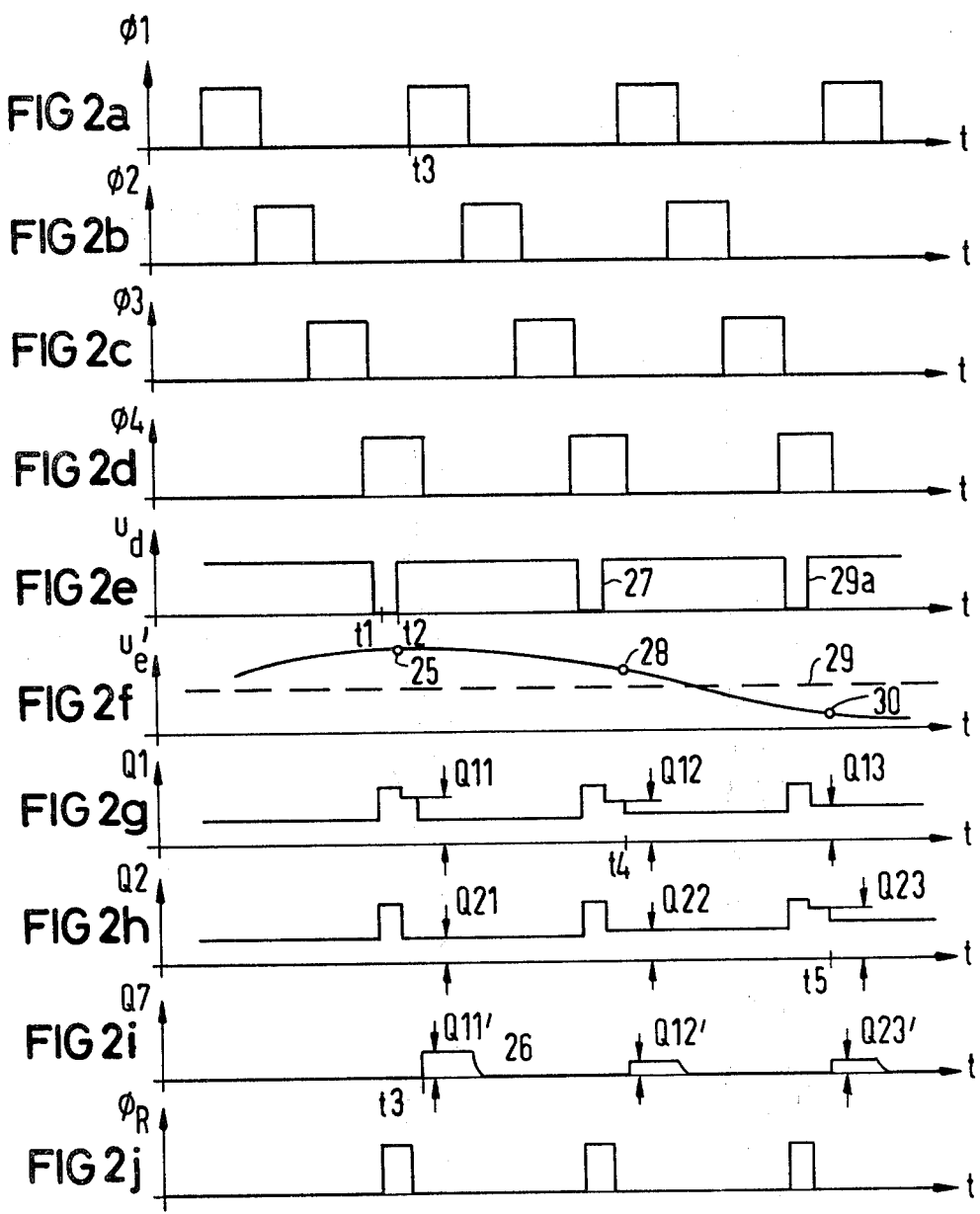

INTEGRATED RECTIFIER CIRCUIT

BACKGROUND OF THE INVENTION

1. Field of the Invention

The present invention relates to an integrated rectifier circuit and in particular to such a circuit utilizing a charge transfer device (CTD) which is realizable in metal-insulator-semiconductor (MIS) technology.

2. Description of the Prior Art

In semiconductor circuit technology, as in other electrical applications, the alternating voltage component of an analog input signal must be rectified in order to make further use of the signal. Heretofore, such rectification has been undertaken utilizing transformers or semiconductor diodes. Such conventional rectifying devices present difficulties when interfaced with other types of electrical components, such as monolithically integrated circuits.

SUMMARY OF THE INVENTION

It is an object of the present invention to provide an integrated rectifier circuit which can be monolithically integrated in a simple manner and moreover can be easily simultaneously manufactured on the same circuit board as other integrated circuit parts which are utilized for the further analog processing of input signals.

Such a circuit consists of a doped semiconductor body in which first and second oppositely doped regions are disposed at the boundary surface thereof such as by a diffusion or ion implantation process. The semiconductor body is covered with an electrically insulating layer. A first pair of input gate electrodes are disposed on the insulating layer which are associated with the first oppositely doped region, and a second pair of input gate electrodes are also disposed on the boundary region which are associated with the second oppositely doped region.

The two oppositely doped regions are connected to a clock pulse pulse voltage and all of the input gate electrodes in each of the first and second pairs are connected to a constant voltage source having a magnitude such that a uniform surface potential exists in the semiconductor regions covered by the electrodes. The input gate electrode of the first electrode pair which is disposed at a greater distance from the first oppositely doped region is charged with the alternating voltage component of an input signal. The input gate electrode of the second pair of gate electrodes which is disposed closer to the second oppositely doped region is also charged with the alternating voltage component of an input signal.

A charge transfer device channel which is covered with any number of transfer electrodes is joined to the semiconductor regions covered by the gate electrodes and has a charge transfer device output stage which serves to couple an output signal to external circuitry. The alternating voltage component of the output signal is rectified as a result of charge transfer being momentarily interrupted by the negative portions of the alternating voltage component supplied to the respective ones of the pairs of gate electrodes.

In a second embodiment of the invention, a third oppositely doped region may be provided in the semiconductor body and a third input stage associated therewith which is connected to the charge transfer device transfer electrodes. The charge packets within the charge transfer device which are generated as a result of the alternating voltage component input is thus further augmented by the charge generated by the third input stage as a so called basic charge.

Charge transfer devices which may be employed in the circuit disclosed herein are described and the operation thereof explained, for example, in the text entitled: "Charge Transfer Devices" by Sequin and Tompsett, published by Academic Press of New York, 1975. The basic concepts employed in the present invention are described in pages 1 through 18 of that publication, as well as charge transfer devices functioning in two-, three-, four- or multi-phase operation. A number of charge transfer device output stages which may be utilized in connection with the present invention are also described in pages 52 through 58 of the text.

DESCRIPTION OF THE DRAWINGS

FIGS. 1a through 1d are related figures with

FIG. 1a showing a sectional view of an integrated rectifier circuit having an input stage, a charge transfer device channel and an associated output stage, FIG. 1b is a graphic representation of the surface potential at regions of the device shown in FIG. 1a, FIG. 1c is a second input stage for the device of FIG. 1a, and FIG. 1d is a graphic representation of the surface potential in regions of the portion of the device shown in FIG. 1c.

FIGS. 2a through 2j are graphic representations of the temporal relation between the phases, voltages, and charge packets utilized in conjunction with the operation of the device shown in FIGS. 1a through 1d.

DESCRIPTION OF THE PREFERRED EMBODIMENTS

Figure 1A:
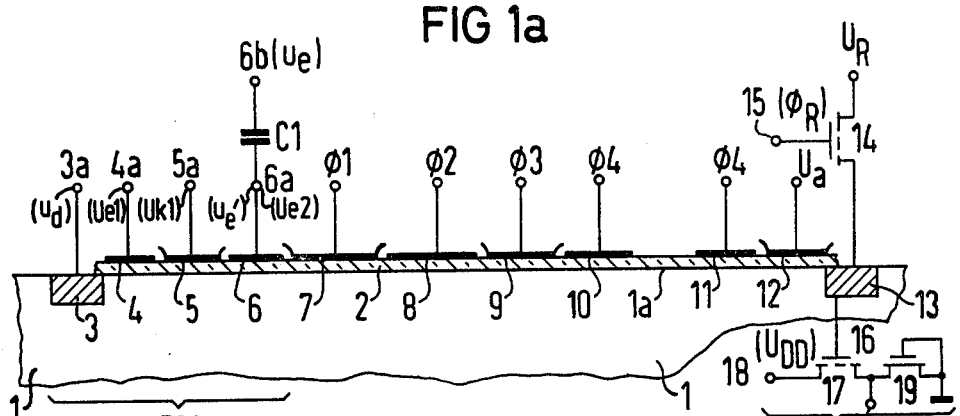

A portion of an integrated rectifier circuit realizable in metal-insulator-semiconductor (MIS) technology is shown in section in FIG. 1a. The device has a doped semiconductor body or substrate 1 which may consist, for example, of p-conductive silicon. The substrate 1 has a boundary surface 1a which is covered with a thin electrically insulating layer 2 which may consist, for example, of silicon dioxide and in the particular embodiment described herein is designated as a gate oxide layer. A first oppositely doped region 3, which in the present example is an n-conductive region, is situated in the substrate 1 at the boundary surface 1a and may be generated therein by means of a diffusion or implantation process known in the art. The oppositely doped region 3 has a terminal 3a.

The region of the substrate 1 next to the first oppositely doped region 3 is covered by input gate electrodes 4, 5 and 6 which are disposed on the gate oxide layer 2. The electrodes 4, 5 and 6 have respective terminals 4a, 5a and 6a. At an increasing distance from the first oppositely doped region 3, a series of transfer electrodes 7, 8, 9, 10 and 11 are disposed on the gate oxide layer 2, with the transfer electrode 7 being disposed in a known manner with respect to the input gate electrode 6 so as to connect a charge transfer device channel thereto. Any four successive transfer electrodes, for example, transfer electrodes 7 through 10, are connected at respective terminals with one of four clock voltages $\phi 1$, $\phi 2$, $\phi 3$ and $\phi 4$ which are phase displaced with respect to one another. The electrodes 7 through 10 thereby form a stage of a charge transfer device. Further charge transfer device stages follow in succession, of which only the last transfer electrode 11 of the last stage is illustrated in FIG. 1a, which is connected to the clock voltage $\phi 4$. The region at the surface of the semiconductor body 1 beneath the electrodes 7 through 11 represents the entire charge transfer device transfer channel.

An output gate 12 is disposed on the gate oxide layer 2 next to the last transfer electrode 11 and is connected through a terminal to a constant voltage $U_a$. The output gate 12 belongs to a charge transfer device output stage generally referenced at AS which also includes an output region 13 within the substrate 1 which is doped oppositely to the substrate. The output region 13 is connected to a reference voltage $U_R$ through the source and drain of a field effect transistor 14. The gate of the field effect transistor 14 is connected at a terminal 15 to a clock pulse voltage $\phi_R$. The output region 13 is also connected to the gate 16 of a second field effect transistor 17 which has a source-drain connection through a terminal 18 to a supply voltage $U_{DD}$ and is also connected through a load element 19 to a reference potential. The load element 19 as shown in FIG. 1a is a field effect transistor operating in the depletion mode having a gate which is connected to its source. The junction of the transistor 17 and the load element 19 is connected to a circuit output 20 at which an output signal $U_a$ appears.

The first oppositely doped region 3 in combination with the input gate electrodes 4, 5 and 6 form a charge transfer device input stage generally referenced at ES1. A clock pulse voltage $u_d$ is supplied to the region 3 through its terminal 3a in the conventional manner of operating such an input stage. In contrast to conventional operation of such devices, however, the terminals 4a and 6a are respectively supplied with constant voltages Ue1 and Ue2 which are selected to be of such a magnitude that the same surface potential P1 exists in the semiconductor regions at the boundary surface 1a which are covered by the input gate electrodes 4 and 6 as exists in the center of the range of modulation of the input stage ES1. The electrode 5 is connected to a constant voltage Uk1 through its terminal 5a. An analog input signal $u_e$ is supplied to a terminal 6b which is connected to the terminal 6a through a capacitance C1. Because the direct voltage component of $u_e$ is cut off by the capacitance C1, only the alternating voltage component $u_e'$ of $u_e$ arrives at the terminal 6a.

Figure 1B:
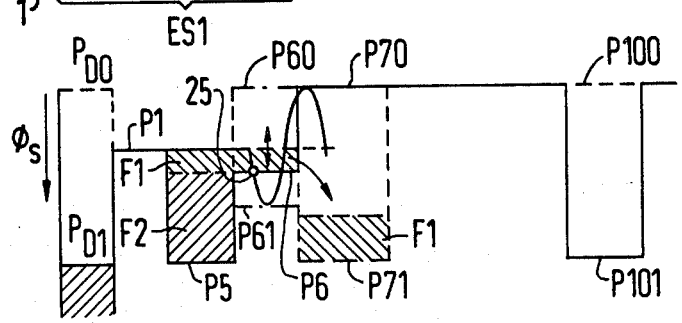
Figure 1C:
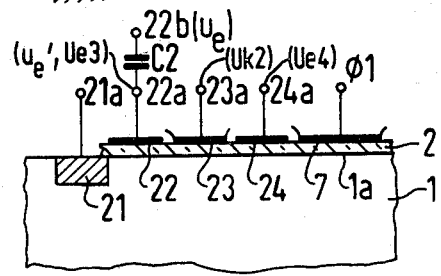

As shown in FIG. 1c, a second charge transfer device input stage ES2 is disposed on the semiconductor body 1. The second input stage has a second oppositely doped region 21 which has a terminal 21a, and has input gate electrodes 22, 23 and 24 disposed on the gate oxide layer having respective terminals 22a, 23a and 24a. The input gate electrode 24 is coupled to the transfer electrode 7 in the same manner as is the input gate electrode 6 associated with the first input stage. The charge transfer device transfer channel is thus commonly allocated to both of the input stages shown in FIGS. 1a and 1c.

The terminals 22a and 24a are respectively connected to constant voltages Ue3 and Ue4 which are selected of such a magnitude that the aforementioned surface potential P1 also exists at the boundary surface 1a in the semiconductor regions beneath the electrodes 22 and 24. The input signal $U_e$ is supplied to a terminal 22b which is connected through a capacitance C2 to the terminal 22a so that only the alternating voltage component $u_e'$ of the input signal $u_e$ is present at the terminal 22a. The terminal 23a is connected to a constant voltage Uk2.

The operation of the circuit will be described in connection with the graphic representations of the surface potential $\phi_s$ which is present in the substrate 1. The representation of $\phi_s$ shown in FIG. 1b corresponds to the structure shown in FIG. 1a, while the graphic representation of $\phi_s$ shown in FIG. 1d corresponds to the structure shown in FIG. 1c. The temporal relation of various voltages, clock pulses and charge packets is shown in FIGS. 2a through 2j to which reference will also be made during the following discussion of the operation of the circuit.

Figure 1D:
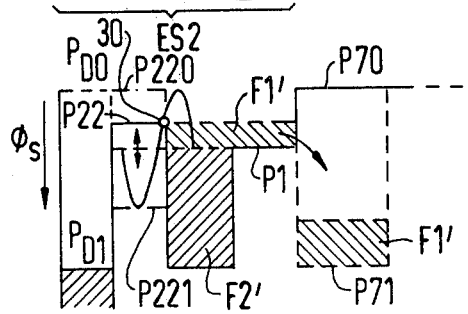

The voltage-time diagrams shown in FIGS. 2a through 2d respectively represent the clock pulse voltages $\phi 1$ through $\phi 4$. The voltage $u_d$ which is applied to the first oppositely doped region 3 is shown in FIG. 2e from which it can be seen that during a portion of the clock pulses $\phi 4$ the voltage $u_d$ is reduced in value. As a result thereof, as is shown in FIGS. 1b and 1d, the surface potential in the oppositely doped regions 3 and 21 is briefly changed from the value $P_{D1}$ to the smaller value of $P_{D0}$. This may occur, for example, at a point in time t1. The semiconductor regions below the electrodes 4, 5 and 6 as well as below the electrodes 22, 23 and 24 are thus flooded by charge carriers. Upon a successive rise of the potential in the regions 3 and 21, at a time t2, a portion of those charge carriers flows back into the regions 3 and 21 over the potential thresholds which are present beneath the electrodes 4 and 22. Charge amounts having magnitudes as indicated in FIGS. 1b and 1d by the shaded areas are retained beneath the electrodes 4 and 5 as well as beneath the electrodes 23 and 24. These charge amounts are dependent upon the potential profiles which occur beneath the input gate electrodes at the time t2.

The potential value P1 beneath the electrode 4 and P5 beneath the electrode 5, which is determined by the constant voltage Uk1, occur at a point t2 for the input stage ES1, as does the potential value P6 beneath the electrode 6. The potential value P6 depends on the potential value P1 and the superimposed potential value resulting from the alternating voltage component $u_e'$ of the signal $u_e$. In FIGS. 1b and 1d, a sinusoidal path representing $u_e'$ is assumed and is shown in the potential diagrams beneath the electrodes 6 and 22 with the line corresponding to the surface potential P1 simultaneously serving as a time axis for that representation. The alternating voltage component $u_e'$ is also shown in FIG. 2f.

For the purpose of further analysis, a value 25 shown in FIG. 2f is assumed to lie on the positive sine half-wave which occurs at a time t2 and results in the potential P6 which is shown below the electrode 6. During the further temporal course of the input signal, potential fluctuations between the limiting values P61 and P60, as shown in FIG. 1b, occur below the electrode 6. Potential values corresponding to the indicated value P70 result at a time t2 beneath the transfer electrodes which are charged with the clock pulse voltages $\phi 1$ through $\phi 3$ (transfer electrodes 7, 8 and 9 in the present example) and a potential value P101 occurs only beneath the electrode 10 and beneath all other electrodes charged with the clock pulse voltage $\phi 4$. The surface potential diagrams shown in FIGS. 1b and 1d are thus valid for the time t2. A charge packet Q1 which is stored beneath the gate electrodes 5 and 6 is shown in the shaded areas F1 and F2 in FIG. 1b. The temporal course of the charge packet Q1 is shown in FIG. 2g with the value designated at Q11 corresponding to the areas F1 and F2 in FIG. 1b, which value Q11 occurs at a time t3. At the time t3, the leading edge of the clock pulse $\phi 1$ occurs so that the charge packet designated at F1 flows beneath the transfer electrode 7. The temporal course of the charge packet Q7 collected beneath the transfer electrode 7 is shown in FIG. 2i wherein the value occurring at the time t3 is designated at Q11' corresponding to F1. Upon the occurrence of the next clock pulse $\phi 2$, the charge Q7 is displaced beneath the next transfer electrode 8 which is characterized by the charge reduction shown at 26.

Upon the occurrence of the next succeeding charge input, which begins with a pulse 27 of the voltage $u_d$, a charge amount Q12 which is determined by the value 28 of the alternating voltage component $u_e'$ at a time t4 is stored beneath the electrodes 5 and 6, as is shown in FIG. 2g in the same manner as described above. The zero level 29 of the alternating voltage component $u_e'$ is such that the values 25 and 28 are on the positive half-wave of $u_e'$. The succeeding pulse 29a also results in a flooding of the semiconductor region beneath the electrodes 5 and 6 with charge carriers however these carriers, insofar as they do not remain below the electrode 5 (Q13), again flow back into the oppositely doped region 3 so that no charge carriers flow from the input stage ES1 beneath the electrode 7 as a result of the negative value 30 of $u_e'$ at the time t5.

The position half-wave of $u_e'$, on the other hand, influences the potential $\phi_s$ beneath the electrode 22 in such a manner that the resulting potential values are limited between P1 and P221, as shown in FIG. 1d. As a result, only charges Q2 which either remain beneath the electrode 23 (Q21 and Q22) or flow back into the region 21 are intermediately stored as shown in FIG. 2h in the input stage ES2. Thus, during the positive half-wave of $u_e'$, no charge packets are input from the stage ES2 into the semiconductor region beneath the electrode 7. Only upon the occurrence of the negative half-wave of $u_e'$, which produces a potential fluctuation beneath the electrode 22 between the values P1 and P220, do charge packets collect in the input stage ES2 which are input to the transfer electrode 7. This is because the negative value 30 of $u_e'$ allows the potential threshold P22 to arise beneath the electrode 22. The unbroken line shown in FIG. 1d represents the profile of the surface potential $\phi_s$ beneath the input stage ES2 which exists at the time t5.

The charge which has collected beneath the electrodes 23 and 24 after the termination of the pulse 29a and the return flow of the excess charge carriers over the threshold P22 into the region 21 is represented in FIG. 1d by the shaded areas F1' and F2' and is indicated in FIG. 2h by the value Q23. Upon the occurrence of the next succeeding pulse of the clock pulse voltage $\phi 1$ and the potential trough P71 which results therefrom, the charge packet represented at F1' arrives beneath the transfer electrode 7 which is shown in FIG. 2i by the value Q23'.

In order to simplify the explanation and accompanying drawings, only two charge inputs during the positive half-wave of the signal $u_e'$ at the function values 25 and 28 and a single charge input during the negative half-wave of $u_e'$ at the function value 30 are designated in FIG. 2f. It will be understood, however, that the circuit constructed in accordance with the principles of the present invention will operate at a repitition rate of the voltage $u_d$ as well as of the clock voltages $\phi 1$ through $\phi 4$ which is selected much higher than the frequency of $u_e'$. The repetition rate is selected such that numerous charge inputs occur during every positive half-wave from the stage ES1 and similarly numerous charge inputs occur during every negative half-wave from the stage ES2. The input charge packets are then shifted step-by-step by the sequencing of the clock voltages $\phi 1$ through $\phi 4$ under the series of transfer electrodes in the direction toward the output stage AS, and individually successively arrive at the region 13 over the potential threshold which is formed beneath the gate 12 upon the occurrence of the trailing pulse edge of the clock voltage $\phi 4$.

The output region 13 was previously, that is, during the occurrence of the pulses of $\phi 4$, connected through the transistor 14 and rendered conductive by means of the pulses $\phi_R$ to a reference voltage $U_R$ and is subsequently again disconnected from the reference voltage so that the region 13 is in a "floating" state, then each charge packet entering into the region 13 changes the potential thereof in accord with the magnitude of the function value of $u_e'$ which generated the respective charge input. Thus, the positive and negative function values of $u_e'$, assuming equal absolute amounts, result in charge packets being produced having equal magnitude and thus produce potential changes of equal size in the output region 13. Through the gate 16, these potential changes control the conductivity of the transistor 17 so that the transistor stage 17, in combination with the load element 19 which is connected as a source follower, emits an output signal $u_a$ at the terminal 20 which consists of a bias voltage and a voltage $u_e'$ superimposed thereon which consists of a series of rectified positive half-waves.

In order to achieve an identical uniform potential P1 beneath the electrodes 4 and 6 and 22 and 24, it is preferable to manufacture these electrodes as portions of a full-surface conductive coating which is applied to the insulating layer 2 so that the thickness of the insulating layer 2 beneath the electrodes is as uniform as possible.

The electrodes 5 and 23 may then be generated as portions of a second electrically conductive coating which is applied to a second electrically insulating layer (not shown) which covers the electrodes formed by the first coating. The electrodes 5 and 23 will thus slightly overlap the electrodes 4, 6, 22 and 24 at their marginal zones. With such a circuit design, the constant voltages Ue1, Ue2, Ue3 and Ue4 may be replaced by a single constant voltage. The same manufacturing technique can be transferred to the other electrodes so that, for example, the electrodes 8, 10 and 11 may be formed as portions of the first conductive coating and the electrodes 7, 9 and 12 be formed as portions of the second coating.

Simplification of the circuits shown in FIG. 1a is possible by eliminating the electrodes 5 and 23 and instead placing the electrodes 4 and 6 and the electrodes 22 and 24 in close proximity to one another. In this embodiment, however, thickness variations of the insulating layer 2 result in deviations of the surface potential which cannot be tolerated beneath the electrodes 4, 6, 22 and 24, so that compensation for such thickness variations may be undertaken by appropriate adjustment of the voltages Ue1 through Ue4 with respect to each other.

Figure 3A:
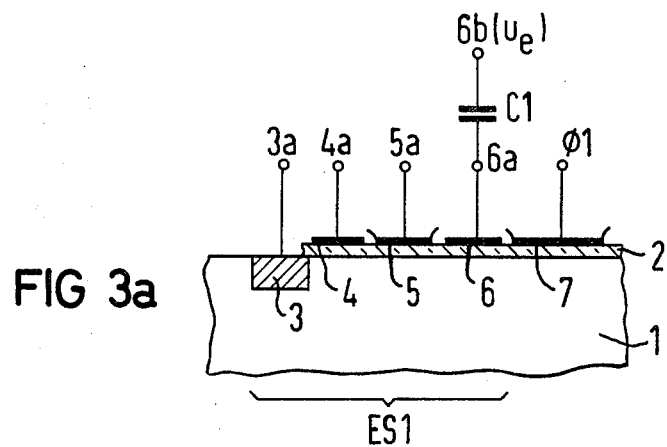
FIGS. 3a through 3c are sectional views of another embodiment of the invention utilizing a third input stage.
Figure 3B:
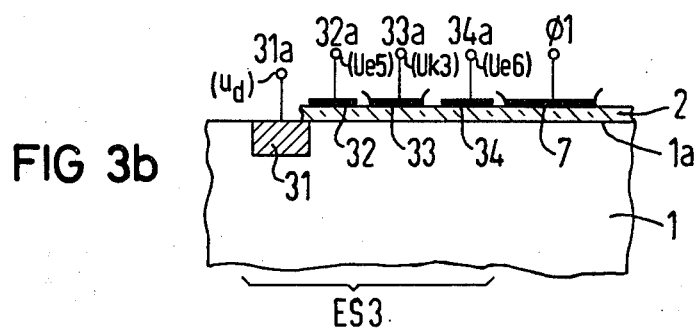
Figure 3C:
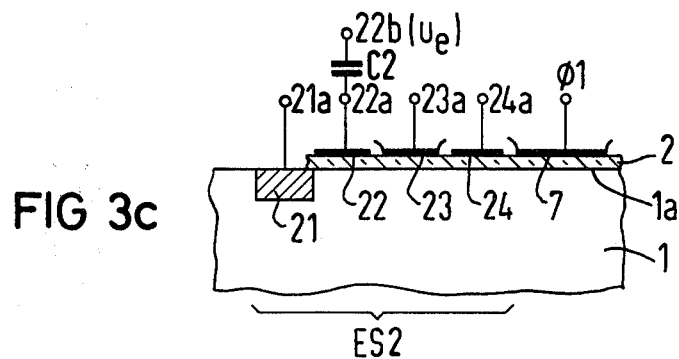

FIGS. 3a, 3b and 3c illustrate a second embodiment of the invention in which a third input stage ES3, shown in FIG. 3b, is disposed in the substrate 1 in addition to the previously-described input stages ES1 and ES2. The third input stage ES3 comprises a third oppositely doped region 31 having a terminal 31a and input gate electrodes 32, 33 and 34, having respective terminals 32a, 33a and 34a. The electrodes are disposed on the insulating layer 2 above the boundary 1a in an identical manner to those described above. The first transfer electrode of the charge transfer device transfer stage is joined to the electrode 34 in the manner utilized with the other two input stages. The region 31 is supplied with the voltage $u_d$. The input gate electrode 32 is supplied through its terminal with a constant voltage Ue5, the input gate terminal 33 is supplied via its terminal with a constant voltage Uk3, and the input gate terminal 34 is supplied via its terminal with a constant voltage Ue6. The voltage Ue5 is less than the voltage Ue6 and the latter is less than Uk3. With this arrangement, a charge packet which is dependent upon the surface of the electrodes 33 and 34 and on the difference between the voltages Ue6 and Ue5 arises at each of the previously described charge inputs. The charge packet is also present beneath the transfer electrode 7 and adds to the charge packets resulting from the alternating component $u_e'$ as a so called "basic charge." The remainder of the charge transfer device transfer channel and the output stage AS of course follow the structure shown in FIG. 3b.

The input stage ES3 may also be manufactured in the manner described above with the electrodes 32 and 34 being formed from portions of a first conductive coating and the electrode 33 being formed from a portion of a second conductive coating. As with the other input stages, the electrode 33 may be omitted for simplification of the circuit if the electrodes 32 and 34 are placed in very close proximity.

In some applications, the circuit described herein may be further modified by manufacturing the transfer gate electrode 7 or the gates 7 and 8 with greater dimensions in the longitudinal direction than the remaining transfer electrodes 9 through 11. In so doing, an undesired return flow of charge carriers from the charge packets indicated at F1 and F1' from the potential trough P71 into the regions 3 and 21 is substantially eliminated.

Although the above discussion has described rectification of a sinusoidal alternating voltage component $u_e'$, the inventive concept herein can also be applied to input signals $u_e$ having alternating voltage components in triangular, sawtooth or any other periodic or non-periodic function.

The input gate electrodes and the transfer electrodes may consist of highly doped polycrystalline silicon. Those electrodes formed from the second conductive coating may be manufactured of metal, for example, aluminum.

Although the above discussion disclosed a charge transfer device arrangement designed as a SCCD arrangement, that is, a charge coupled arrangement in which the charges are shifted at the surface of the substrate 1. The inventive concept herein can also be realized, however, in charge transfer device arrangements in which a charge transfer occurs in the interior of the semiconductor layer which are generically referred to as BCCD arrangements. In general, any arrangements falling under the concept of a charge transfer device may be employed in the invention, such as those referred to in the text "Charge Transfer Devices" identified above.

Although other modifications and changes may be suggested by those skilled in the art, it is the intention of the inventors to embody within the patent warranted hereon all changes and modifications as reasonably and properly come within the scope of their contribution to the art.

We claim as our invention:

1. An integrated rectifier circuit comprising:
   a doped semiconductor substrate having a boundary surface;
   an insulating layer covering said boundary surface;
   a plurality of transfer electrodes on said insulating layer respectively charged with successive clock pulses forming a charge transfer device transfer channel in a region of said substrate beneath said transfer electrodes;
   a first input stage for said charge transfer device transfer channel consisting of
      a first region disposed in said substrate at said boundary layer and doped oppositely thereto,
      a first pair of input gate electrodes disposed on said insulating layer between said first region and said transfer channel;
   a second input stage for said charge transfer device transfer channel consisting of
      a second region disposed in said substrate at said boundary layer and doped opposite thereto,
      a second pair of input gate electrodes disposed on said insulating layer between said second region and said transfer channel;
   said first and second regions being connected to a common clock pulse voltage;
   each of said input gate electrodes being connected to respective constant voltage sources having a magnitude such that a uniform surface potential is generated in the substrate regions covered by the input gate electrodes;
   one of said input gate electrodes in said first pair which is disposed at a greater distance from said first region being charged with an alternating voltage component of an input signal;
   one of said input gate electrodes in said second pair disposed closer to said second region being charged with said alternating voltage component of said input signal;
   a third input stage for said charge transfer device consisting of
      a third region disposed in said substrate having a conductivity type opposite to that of said substrate,
      a third pair of input gate electrodes disposed on said insulating layer between said third region and said transfer channel,
   said input gate electrodes in said third pair being respectively connected to constant voltage sources of differing magnitudes with an input gate electrode of said third pair which is disclosed closer to said third region being charged with a smaller of the constant voltages; and
   an output stage for said charge transfer device at which an output signal is generated,
   whereby said alternating voltage component in said output signal is rectified.

2. The integrated rectifier circuit of claim 1 wherein at least a first transfer electrode in the direction of charge transfer in said transfer channel has a greater dimension in the direction of charge transfer than the successive transfer electrodes.

3. The integrated rectifier circuit of claim 1 wherein said output stage includes an output region disposed in said substrate at said boundary layer and oppositely doped thereto, said output region being pulse-connected to a reference potential and disconnected from external potentials and being further connected to a control input of a transistor stage.

4. An integrated rectifier circuit comprising:
 a doped semiconductor substrate having a boundary surface;
 an insulating layer covering said boundary surface;
 a plurality of transfer electrodes on said insulating layer respectively charged with successive clock pulses forming a charge transfer device transfer channel in a region of said substrate beneath said transfer electrodes;
 a first input stage for said charge transfer device transfer channel consisting of
  a first region disposed in said substrate at said boundary layer and doped oppositely thereto,
  a first pair of input gate electrodes disposed on said insulating layer between said first region and said transfer channel;
 a second input stage for said charge transfer device transfer channel consisting of
  a second region disposed in said substrate at said boundary layer and doped oppositely thereto,
  a second pair of input gate electrodes disposed on said insulating layer between said second region and said transfer channel;
 said first and second regions being connected to a common clock pulse voltage;
 each of said input gate electrodes being connected to respective constant voltage sources having a magnitude such that a uniform surface potential is generated in the substrate regions covered by the input gate electrodes;
 one of said input gate electrodes in said first pair is disposed at a greater distance from said first region being charged with an alternating voltage component of an input signal;
 one of said input gate electrodes in said second pair disposed closer to said second region being charged with said alternating voltage component of said input signal;
 an additional input gate electrode disposed on said insulating layer between said input gate electrodes in each of said first and second pairs, each of said additional input gate electrodes being connected to a constant voltage source having a magnitude greater than a maximum value of said input signal; and
 an output stage for said charge transfer device at which an output signal is generated,
 whereby said alternating voltage component in said output signal is rectified.

5. The integrated rectifier circuit of claim 4 wherein said input gate electrodes in said first and second pairs are each formed of a portion of a first electrically conductive coating covering said insulating layer and wherein each of said additional input gate electrodes is formed of a portion of a second electrically conductive layer on said insulating layer.

* * * * *